(12) United States Patent
Soussan et al.

(10) Patent No.: US 9,105,621 B2
(45) Date of Patent: Aug. 11, 2015

(54) METHOD FOR BONDING OF GROUP III-NITRIDE DEVICE-ON-SILICON AND DEVICES OBTAINED THEREOF

(71) Applicant: IMEC, Leuven (BE)

(72) Inventors: Philippe Soussan, Leuven (BE); Melina Lofrano, Kumtich (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/103,143

(22) Filed: Dec. 11, 2013

(65) Prior Publication Data
US 2014/0175676 A1 Jun. 26, 2014

Related U.S. Application Data

(60) Provisional application No. 61/740,014, filed on Dec. 20, 2012.

(51) Int. Cl.
*H01L 33/00* (2010.01)
*H01L 21/44* (2006.01)
(Continued)

(52) U.S. Cl.
CPC ........ *H01L 23/49544* (2013.01); *H01L 21/185* (2013.01); *H01L 23/49506* (2013.01); *H01L 23/562* (2013.01); *H01L 21/6835* (2013.01); *H01L 24/05* (2013.01); *H01L 24/13* (2013.01); *H01L 24/16* (2013.01); *H01L 24/81* (2013.01); *H01L 2221/6835* (2013.01); *H01L 2221/68363* (2013.01); *H01L 2224/0401* (2013.01); *H01L 2224/05569* (2013.01); *H01L 2224/10125* (2013.01); *H01L 2224/16227* (2013.01); *H01L 2224/81005* (2013.01); *H01L 2224/81007* (2013.01); *H01L 2224/81193* (2013.01); *H01L 2924/00014* (2013.01); *H01L 2924/3511* (2013.01); *H01L 2924/3512* (2013.01)

(58) Field of Classification Search
CPC .............. H01L 23/49544; H01L 24/83; H01L 23/49506; H01L 21/185; H01L 23/562; H01L 2924/3512; H01L 2924/3511; H01L 2224/05569
USPC ........... 438/108, 173, 142, 197, 97, 233, 401, 438/667, 671, 928; 257/94, 96, 101, 3, 190, 257/191, 462, 778, 499, 369, 275, 72, 347, 257/353, 67, 100, 173, 2, 355
See application file for complete search history.

(56) References Cited

U.S. PATENT DOCUMENTS 6,377,596 B1 * 4/2002 Tanaka et al. .............. 372/45.01
6,611,002 B2 * 8/2003 Weeks et al. .................... 257/94
(Continued)

*Primary Examiner* — Alexander Oscar Williams
(74) *Attorney, Agent, or Firm* — McDonnell Boehnen Hulbert & Berghoff LLP

(57) ABSTRACT

A method for flip chip bonding a GaN device formed on a silicon substrate is described. The method includes providing a silicon substrate having a GaN device thereon, the GaN device comprising at least one gallium-nitride layer near the silicon substrate and remote from the silicon substrate a dielectric layer comprising at least one via configured to electrically contact the at least one gallium-nitride layer, forming a stiffener layer over the GaN device leaving the at least one via exposed, flip chip bonding the GaN device to a submount, wherein the stiffener layer physically contacts the submount and the submount is electrically connected to the at least gallium-nitride layer through the via, and completely removing the silicon substrate exposing the GaN device. Preferably, the material of the stiffener layer comprises silicon, such as silicon, silicon-germanium, or silicon-carbide.

14 Claims, 3 Drawing Sheets

(51) Int. Cl.
*H01L 21/48* (2006.01)
*H01L 23/48* (2006.01)
*H01L 27/06* (2006.01)
*H01L 23/495* (2006.01)
*H01L 23/00* (2006.01)
*H01L 21/18* (2006.01)
*H01L 21/683* (2006.01)

(56) References Cited

U.S. PATENT DOCUMENTS

| | | | |
|---|---|---|---|
| 8,410,580 B2 * | 4/2013 | Hill et al. | 257/621 |
| 8,440,542 B2 * | 5/2013 | Sekar et al. | 438/455 |
| 8,686,428 B1 * | 4/2014 | Sekar et al. | 257/72 |
| 8,742,476 B1 * | 6/2014 | Or-Bach et al. | 257/275 |
| 8,803,206 B1 * | 8/2014 | Or-Bach et al. | 257/278 |
| 8,836,073 B1 * | 9/2014 | Or-Bach et al. | 257/499 |
| 8,901,613 B2 * | 12/2014 | Sekar et al. | 257/202 |
| 2009/0050926 A1 * | 2/2009 | Suehiro et al. | 257/100 |
| 2009/0179207 A1 * | 7/2009 | Chitnis et al. | 257/88 |
| 2012/0326215 A1 * | 12/2012 | Srivastava et al. | 257/288 |
| 2014/0141552 A1 * | 5/2014 | Zou et al. | 438/28 |
| 2014/0220716 A1 * | 8/2014 | Steigerwald et al. | 438/27 |
| 2014/0235002 A1 * | 8/2014 | Rong et al. | 438/29 |
| 2014/0326295 A1 * | 11/2014 | Moslehi | 136/249 |
| 2014/0353677 A1 * | 12/2014 | Tak et al. | 257/76 |
| 2014/0367695 A1 * | 12/2014 | Barlow | 257/76 |

* cited by examiner

METHOD FOR BONDING OF GROUP III-NITRIDE DEVICE-ON-SILICON AND DEVICES OBTAINED THEREOF

CROSS REFERENCE TO RELATED APPLICATIONS

The present patent application claims priority under 35 U.S.C. §119(e) to U.S. Provisional Patent Application Ser. No. 61/740,014, which was filed Dec. 20, 2012, the entire contents of which are incorporated herein by reference.

FIELD

The present disclosure is related to the bonding of group III-nitride based devices formed on a silicon substrate. In particular the present disclosure relates to bonding of Galliumnitride-on-silicon (GaN-on-Si) based devices.

BACKGROUND

Group III-nitrides such as gallium-nitride and alloys thereof are becoming popular in the manufacturing of optical devices as well of power devices.

Group III-nitride based devices are predominantly formed on a sapphire substrate as the lattice mismatch between the sapphire substrate and the group III-nitride layers is minimal.

In order to reduce the overall manufacturing cost, there is tendency to grow the group III-nitride layers on a silicon substrate. This approach is commonly known as gallium nitride-on-silicon (GaN-on-Si). An advantage of this GaN-on-Si approach is that it allows manufacturing of such group-III nitride based devices on established silicon manufacturing equipment resulting in a reduced manufacturing cost.

However, due to strain created by the lattice mismatch between the group-III nitride layers and the silicon substrate, bowing and cracking of the GaN-on-Si wafers is a concern. Moreover, as the silicon substrate is opaque, this silicon substrate needs to be removed in case the group-III nitride based device is intended for optical applications.

Hence, there is a need for method for forming group III-nitride based devices which method offers an improved immunity towards strain induced in the group III-nitride based device.

SUMMARY

In a first aspect, a method is disclosed for bonding a group III-nitride based device formed on a silicon substrate. The method comprises providing a silicon substrate having at least one group III-nitride based device thereon, the group III-nitride based device comprising at least one group III-nitride layer near the silicon substrate and remote from the silicon substrate a dielectric layer comprising at least one via configured to electrically contact the at least one group III-nitride layer, forming a stiffener layer over the group III-nitride based device thereby leaving the at least one via exposed, flipping over the silicon substrate comprising the at least one group III-nitride based device to a submount, whereby the stiffener layer physically contacts the submount and the submount is electrically connected to the at least group III-nitride layer through the via, and completely removing the silicon substrate thereby exposing the at least one group III-nitride based device.

The material of the stiffener layer preferably comprises silicon. The silicon material of the stiffener layer can be selected from the group of silicon, silicon-oxide, silicon-germanium, and silicon-carbide.

The submount, to which the group III-nitride based device is flipped over and is mounted to, can be a multilayer board such as a PCB board.

This submount can be a silicon submount, preferably one in which at least one through-silicon-via (TSV) is formed to allow a backside electrical contact of the group III-nitride based device through the at least one via.

In a second aspect, a group III-nitride based device assembly is disclosed. This assembly comprises a group III-nitride based device flipped over and bonded to a submount. The group III-nitride based device comprises at least one group III-nitride layer remote from the submount and near the submount a dielectric layer comprising at least one via configured to provide an electrical contact between the at least one group III-nitride layer and the submount, whereby a stiffener layer, in physical contact with the submount, separates the group III-nitride device from this submount.

The material of the stiffener layer preferably comprises silicon. The silicon material of the stiffener layer can be selected from the group of silicon, silicon-oxide, silicon-germanium, and silicon-carbide.

The submount, to which the group III-nitride based device is flipped over and mounted to, can be a multilayer board such as a PCB board.

This submount can be a silicon submount, preferably one in which at least one through-silicon-via (TSV) is formed to allow a backside electrical contact of the group III-nitride based device through the via.

BRIEF DESCRIPTION OF THE FIGURES

For the purpose of teaching this disclosure figures are added. The cross sectional drawings are not to scale and are only intended to illustrate the relative position of the different elements of the devices discussed.

DETAILED DESCRIPTION

A method is disclosed for bonding a group III-nitride based device formed on a silicon substrate. This bonding process is illustrated by FIGS. 1a to 1d.

A group III-nitride based device 1 is a semiconductor device comprising at least one layer 3 of a group III-nitride material. Examples of such group III-nitride materials are gallium-nitride or aluminium gallium-nitride.

Such group III-nitride based device 1 is formed on a silicon substrate 2 resulting in a group III-nitride on silicon assembly, often referred to as GaN-on-Si devices. On the silicon substrate 2 one or more group III-nitride layers 3 are formed by epitaxial growth. Optionally, a buffer layer, such as a layer of aluminium-nitride, is formed on the silicon substrate 2 prior to the growth of the at least one layer 3 of III-nitride material. This buffer layer between the silicon substrate and the group III-nitride layer 3 alleviates the stress due the lattice mismatch between the silicon substrate 2 and the at least one layer 3 of III-nitride material. The at least one group III-nitride layer 3 is patterned to create the desired layout of the at least one group III-nitride based device 1.

Figure 1:
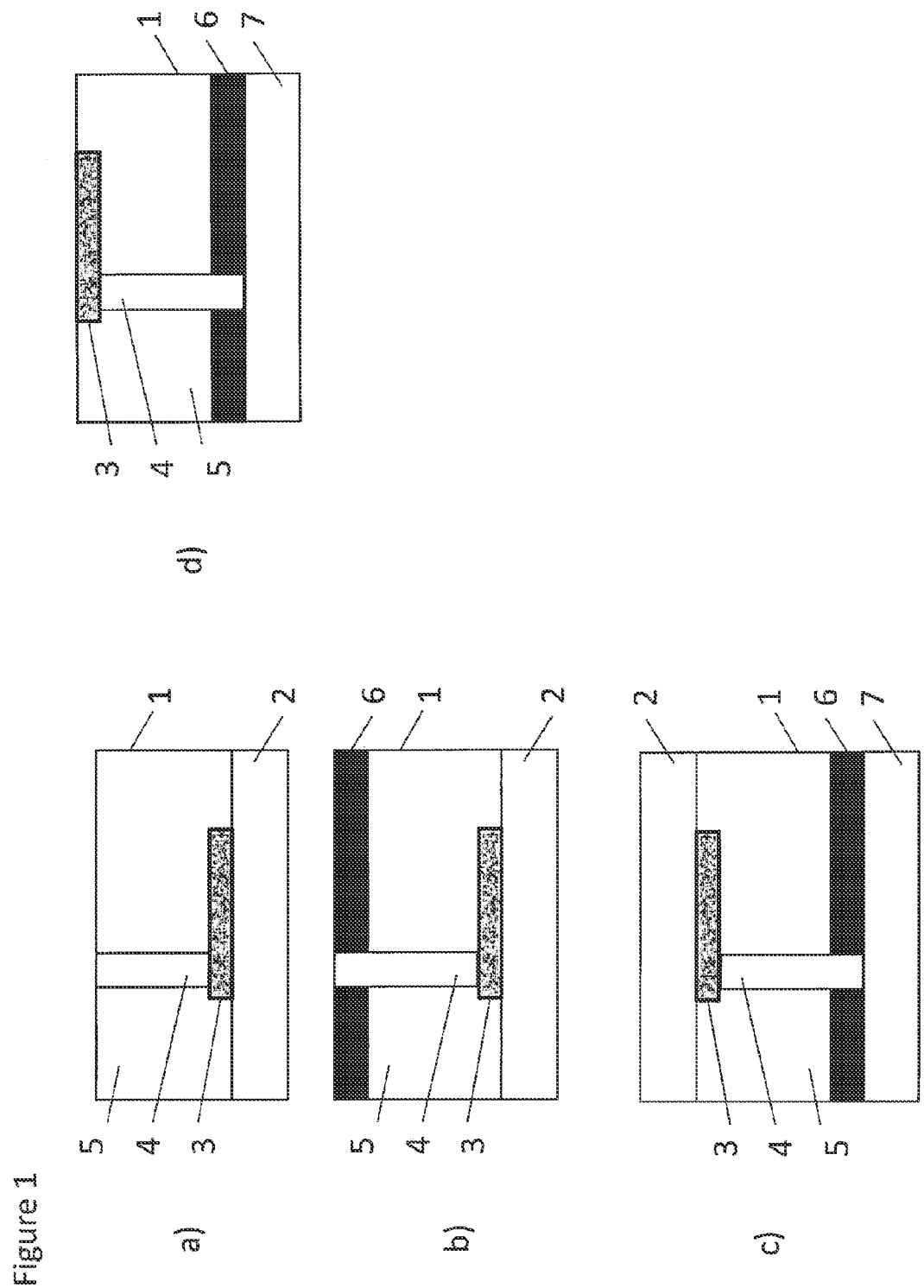
FIGS. 1a to 1d illustrates a process flow using a series of schematic cross sections, according to this disclosure.

The manufacturing of such group III-nitride based device 1 comprises further steps. Junction regions are formed in the at least one group III-nitride layer 3, for example, a PN junction in the case of optical applications or source/drain junctions in the case of power applications. At least one dielectric layer 5 is formed over the at least one group III-nitride layer 3 to provide electrical isolation of the semiconductor layer(s). In this dielectric layer 5 at least one opening 4 is created and filled with conductive material to provide electrical contact to the at least one group III-nitride layer 3. The stack of dielectric layer(s) 5 and contact or via opening(s) 4 is known as the interconnect layer. Figure 1a illustrates such a device.

According to this disclosure, an additional layer 6 is formed on this dielectric layer 5. This layer 6 can be formed prior to the creation of the opening(s) 4. Then the at least one opening 4 is formed in the stack of layer 6 and the at least one dielectric layer 5. Optionally, the layer 6 is formed after the creation and filling of the at least one opening 4. Then an additional lithographic patterning is performed to extend the opening(s) 4 into the layer 6. This extended opening 4 is then filled with conductive material to obtain an electrical conductive path through the dielectric layer 5 and the layer 6 to the at least one group III-nitride layer 3. Figure 1b illustrates such a device.

This layer 6, referred to as stiffener or stress buffer layer, is configured to provide mechanical support to the flipped over group III-nitride based device 1, in particular and during and after the removal of the silicon substrate 2. When removing the silicon substrate 2, the group III-nitride based device 1 can have a tendency to warp. The stiffener layer 6 prevents such warping.

The material of the stiffener layer 6 preferably has a coefficient of thermal expansion (CTE) of 6 ppm/° C. or less. The material of the stiffener layer 6 is preferably silicon based. The silicon material of the stiffener layer 6 is preferably selected from the group of silicon, silicon-oxide, silicon-germanium, and silicon-carbide. The thicker the stiffener layer 6 the better.

After forming the patterned stiffener layer 6, the group III-nitride based device 1 is flipped over and bonded to a submount 7. FIG. 1c illustrates such a device. This submount 7 can be a multilayer board such as a printed circuit board (PCB) board. This submount 7 can be a silicon submount, preferably one in which at least one through-silicon-via (TSV) 8 is formed, thereby forming a backside electrical contact to the group III-nitride based device 1 through the TSV 8 and the via 4. The silicon submount further comprises a leadframe providing an electrical contact between the TSV 8 and the circuit board to which the silicon submount will be mounted.

After bonding the flipped over group III-nitride based device 1 to the submount 7, the silicon substrate 2 can be removed thereby exposing the group III-nitride based device 1. Such a device is shown in FIG. 1d. The removal of the silicon substrate 2 is desired if the group III-nitride device 1 is used for optical applications.

The submount 7 to which the group III-nitride based device 1 is bonded can be a hybrid substrate. The surface of such hybrid submount 7 to which the group III-nitride device 1 is bonded comprises a combination of different materials. Typically, the bonding surface is a combination of conductive and isolating materials. The conductive materials provide an electrical connection isolated by the insulating materials.

Figure 2:
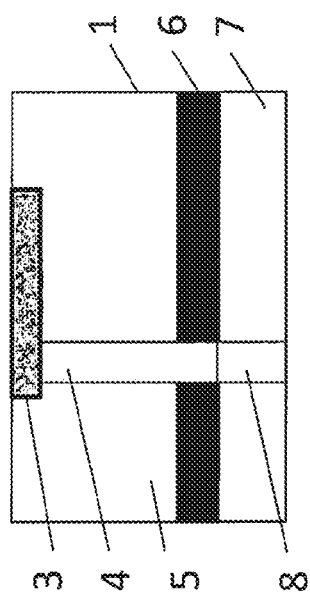
FIG. 2 shows a schematic cross section of at least one group III-nitride based device flip chip bonded, according to this disclosure.

As shown in FIG. 2, the submount 7 can be a silicon submount, preferably one in which at least one through-silicon-via (TSV) 8 is formed, thereby forming a backside electrical contact to the group III-nitride based device 1 through the TSV 8 and the via 4. The group III-nitride based device 1 is flipped over to the silicon submount 7. An electrical contact 10 is formed between the interconnect layer of the group III-nitride based device 1 and the through-silicon-via (TSV) 8 of the silicon submount 7.

Figure 3:
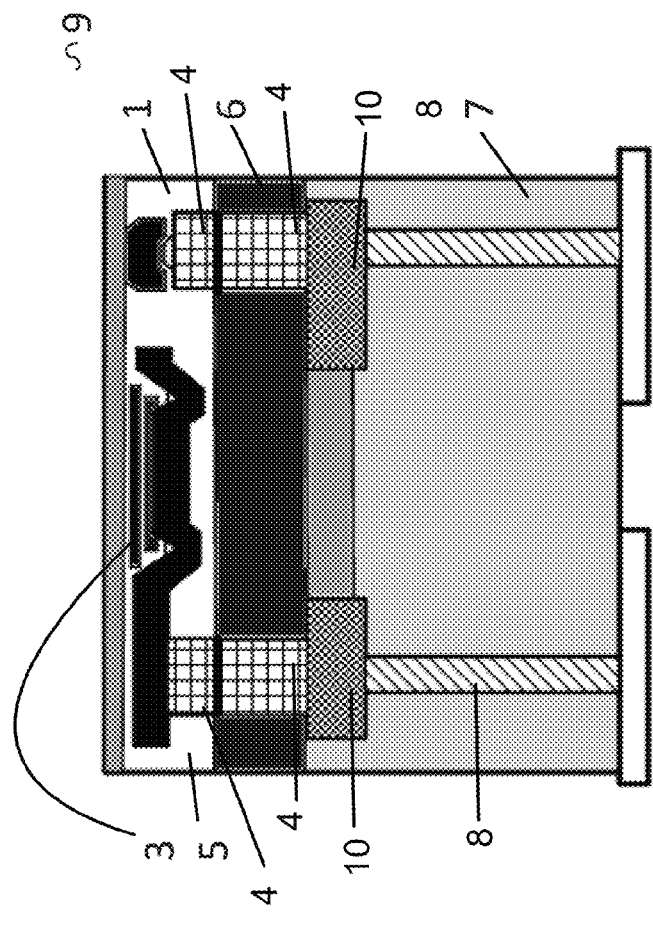
FIG. 3 shows schematic cross section of at least one group III-nitride based device flip chip bonded, according to a particular embodiment of this disclosure.

FIG. 3 shows a particular example of such a group III-nitride based device assembly 9. The device 1 itself comprises a pn-junction formed in group III-nitride material. Vias 4 extend from the bonded surface of the group III-nitride based device 1 through the stiffener layer 6 and the dielectric material 5 to form an electrical contacts to both sides of this pn-junction. These vias 4 are electrically connected 10 to the through-silicon-via (TSV) 8 of the silicon submount 7. This connection 10 can consist of microbumps bonded to each other.

Figure 4:
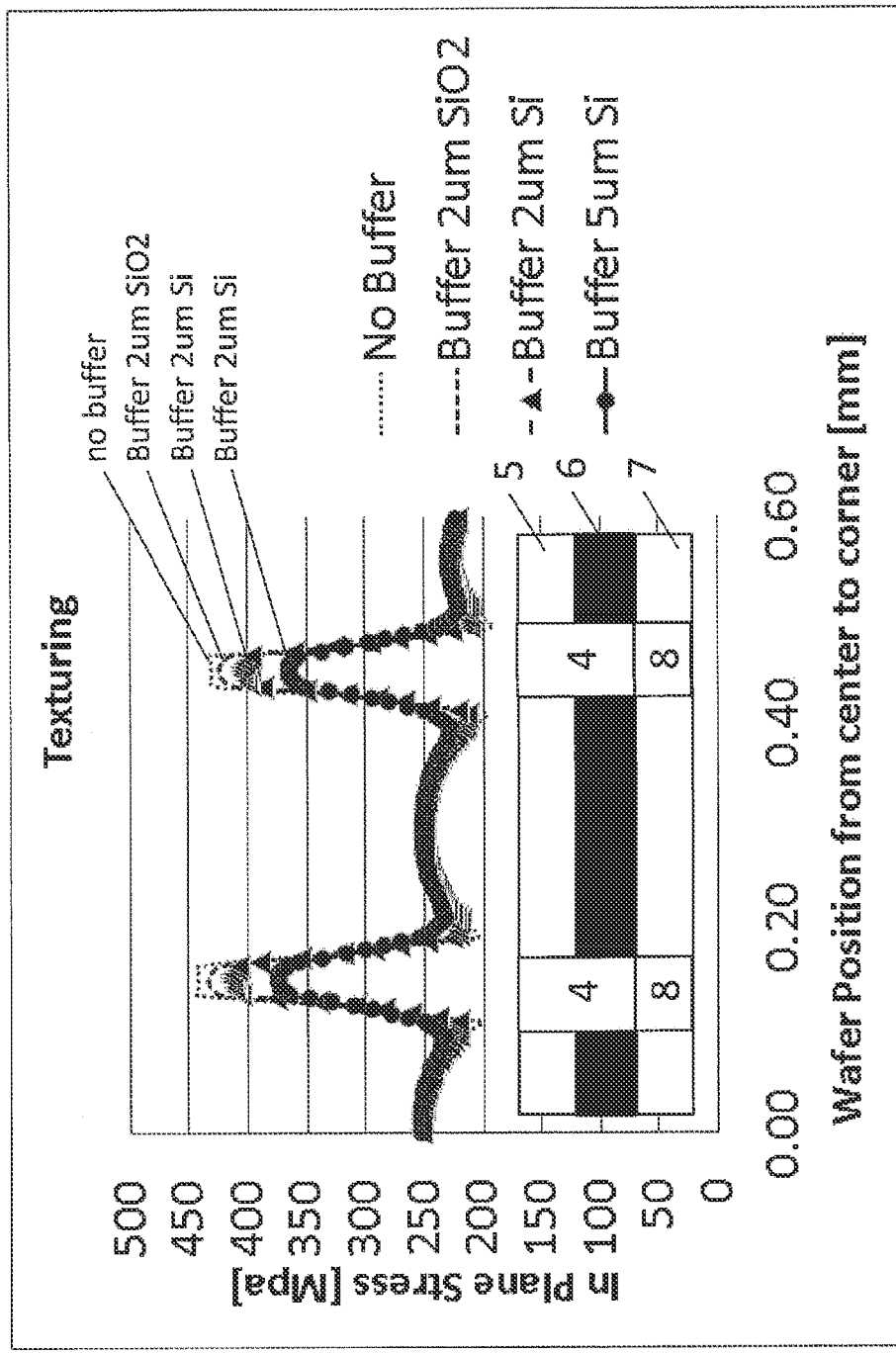
FIG. 4 shows a simulation illustrating the decrease in stress in a GaN device flipped over and bonded, according to this disclosure.

FIG. 4 shows the simulated stress exerted on the group III-nitride based device 1 when flipped over and bonded to a hybrid substrate 7. Due to the different mechanical and/or thermal properties of the (semi)conductive and dielectric materials of this hybrid substrate 7, the group III-nitride based device 1 can locally be subjected to mechanical stress. If a silicon-based stiffener layer 6 is inserted in-between the group III-nitride based device 1 and the hybrid substrate 7, the local stress is reduced as can been seen from the relative shift in stress. This stress reduction is more pronounced if the thickness of this stiffener layer 6 increases.

The invention claimed is:

1. A method for bonding a group III-nitride based device formed on a silicon substrate, the method comprising:
   providing a silicon substrate having at least one group III-nitride based device thereon, the group III-nitride based device comprising at least one group III-nitride layer near the silicon substrate, and remote from the silicon substrate a dielectric layer comprising at least one via configured to electrically contact the at least one group III-nitride layer;
   forming a stiffener layer over the at least one group III-nitride based device leaving the at least one via exposed;
   flipping over and bonding the at least one group III-nitride based device to a submount, wherein the stiffener layer physically contacts the submount and the submount is electrically connected to the at least one group III-nitride layer through the via; and
   removing the silicon substrate to expose the at least one group III-nitride based device.

2. The method of claim 1, wherein a material of the stiffener layer comprises silicon.

3. The method of claim 2, wherein the material of the stiffener layer is selected from the group consisting of silicon, silicon-oxide, silicon-germanium, and silicon-carbide.

4. The method of claim 1, wherein the submount is a multilayer board.

5. The method of claim 4, wherein the multilayer board is a PCB board.

6. The method of claim 1, wherein the submount is a silicon submount.

7. The method of claim 6 wherein the silicon submount comprises at least one through-silicon-via that is electrically connected to the at least one via.

8. A group III-nitride based device assembly, comprising: at least one group III-nitride based device flipped over and bonded to a submount, wherein the group III-nitride based device comprising at least one group III-nitride layer remote from the submount, and near the submount a dielectric layer comprising at least one via configured to provide an electrical contact between the at least one group III-nitride layer and the submount, wherein a stiffener layer in physical contact with the submount separates the at least one group III-nitride based device from the submount.

9. The assembly of claim 8, wherein a material of the stiffener layer comprises silicon.

10. The assembly of claim 9, wherein the material of the stiffener layer is selected from the group consisting of silicon, silicon-oxide, silicon-germanium, and silicon- carbide.

11. The assembly of claim 8, wherein the submount is a multilayer board.

12. The assembly of claim 9, wherein the multilayer board is a PCB board.

13. The assembly of claim 8, wherein the submount is a silicon submount.

14. The assembly of claim 13, wherein the silicon submount comprises at least one through-silicon-via that is electrically connected to the at least one via.

* * * * *